(12) United States Patent
He et al.

(10) Patent No.: US 11,443,780 B2
(45) Date of Patent: Sep. 13, 2022

(54) VERTICAL ACCESS LINE MULTIPLEXOR

(71) Applicant: Micron Technology, Inc., Boise, ID (US)

(72) Inventors: Yuan He, Boise, ID (US); Beau D. Barry, Boise, ID (US); Tae H. Kim, Boise, ID (US); Christopher J. Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/172,257

(22) Filed: Feb. 10, 2021

(65) Prior Publication Data
US 2022/0254388 A1 Aug. 11, 2022

(51) Int. Cl.
*G11C 7/10* (2006.01)
*G11C 7/06* (2006.01)
*G11C 16/32* (2006.01)
*G11C 16/30* (2006.01)

(52) U.S. Cl.
CPC ............ *G11C 7/1012* (2013.01); *G11C 7/065* (2013.01); *G11C 7/1096* (2013.01); *G11C 16/30* (2013.01); *G11C 16/32* (2013.01)

(58) Field of Classification Search
CPC ..... G11C 7/1012; G11C 7/065; G11C 7/1096; G11C 16/30; G11C 16/32
USPC ...................................... 365/189.05
See application file for complete search history.

(56) References Cited

U.S. PATENT DOCUMENTS

| | | | |
|---|---|---|---|
| 10,607,995 B2 | 3/2020 | Roberts et al. | |
| 2013/0159587 A1* | 6/2013 | Nygren | G11C 5/063 710/306 |
| 2018/0323200 A1 | 11/2018 | Tang et al. | |
| 2019/0103406 A1 | 4/2019 | Tang et al. | |
| 2019/0164985 A1 | 5/2019 | Lee et al. | |
| 2020/0176465 A1 | 6/2020 | Tang et al. | |
| 2021/0319819 A1* | 10/2021 | Sanjeevarao | G11C 13/0069 |

* cited by examiner

*Primary Examiner* — Huan Hoang
(74) *Attorney, Agent, or Firm* — Brooks, Cameron & Huebsch, PLLC

(57) ABSTRACT

An access line multiplexor can be formed under vertically stacked tiers of memory cells. The multiplexor can include a first transistor coupled to a vertical access line, to a horizontal access line, and to a second transistor. The second transistor can be coupled to a power supply. The transistors can be n-type metal oxide semiconductor transistors.

17 Claims, 9 Drawing Sheets

US 11,443,780 B2

VERTICAL ACCESS LINE MULTIPLEXOR

TECHNICAL FIELD

The present disclosure relates generally to memory devices, and more particularly, to a vertical access line multiplexor.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device (e.g., a transistor) having first and second source/drain regions separated by a channel region. A gate may oppose the channel region and be separated therefrom by a gate dielectric. An access line, which is sometimes referred to in the art as a word line, is electrically connected to the gate of the DRAM cell. A DRAM cell can include a storage node, such as a capacitor cell, coupled by the access device to a sense line, which is sometimes referred to in the art as a digit line. The access device can be activated (e.g., to select the cell) by an access line coupled to the access transistor. The capacitor can store a charge corresponding to a data value of a respective cell (e.g., a logic "1" or "0").

DETAILED DESCRIPTION

Figure 1:
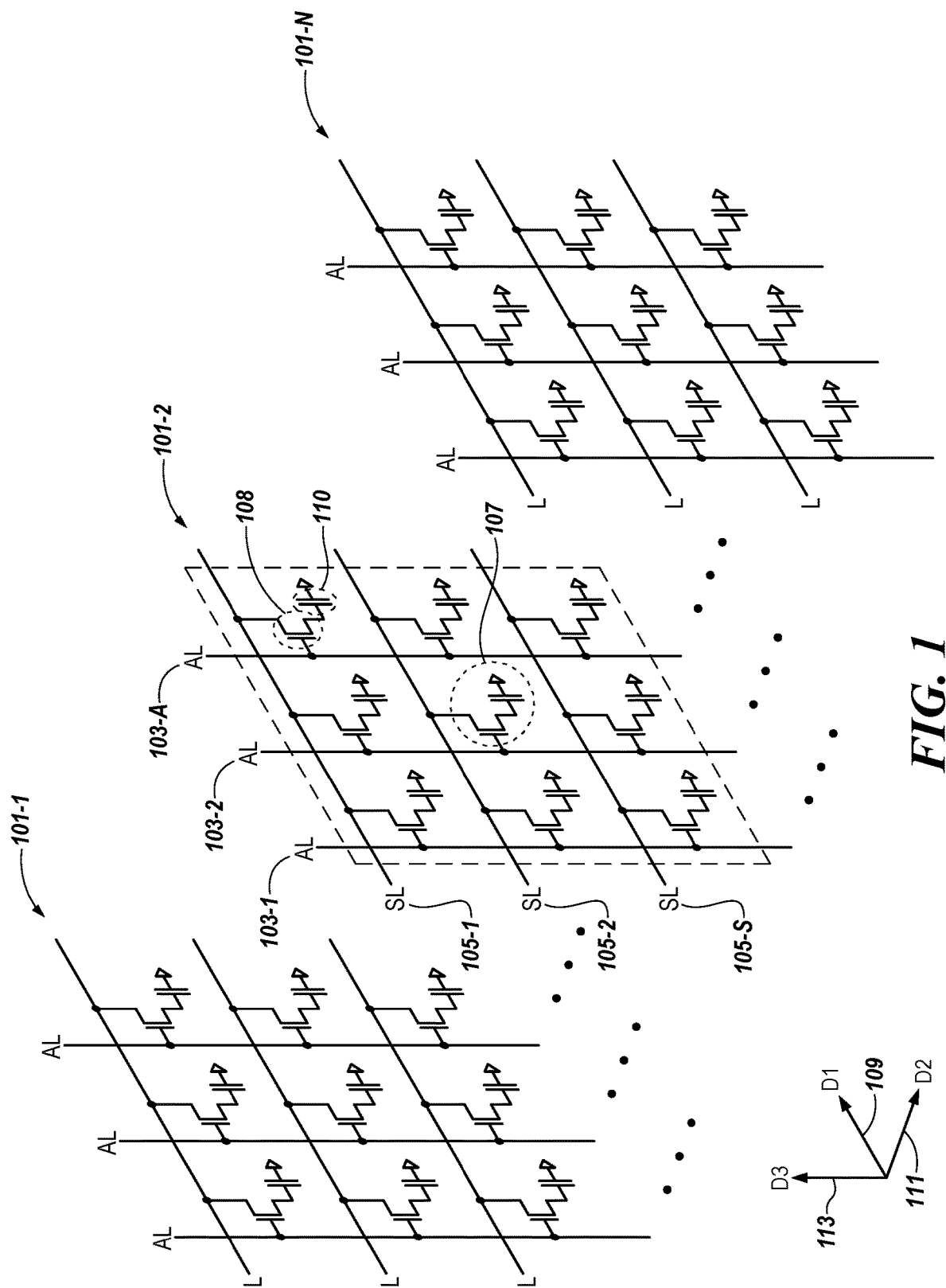
FIG. 1 is a schematic illustration of a portion of vertical three-dimensional (3D) memory in accordance a number of embodiments of the present disclosure.

Embodiments of the present disclosure describe a vertical access line multiplexor for semiconductor devices. A vertical three-dimensional (3D) memory (e.g., 3D-DRAM) in accordance a number of embodiments of the present disclosure can include an array of memory cells made up of vertically stacked tiers of memory cells. The memory cells are controlled and/or accessed via vertical access lines running through the tiers of memory cells and horizontal sense lines running within respective tiers of memory cells. The horizontal sense lines can be coupled to a number of sense amplifiers via staircase connection between a respective sense amplifier and the horizontal sense lines in the tiers. Subsets of the vertical access lines can be coupled to respective horizontal access lines under the array. The horizontal access lines can be coupled to respective access line drivers outside of the array, thereby providing power to subsets of the vertical access lines via the respective horizontal access line. The subset of vertical access lines can each be coupled to the respective horizontal access line via a respective multiplexor, which allows individual vertical access lines to be activated and/or deactivated for reading and writing operations, among other operations.

Embodiments of the present disclosure provide for simplified fabrication of 3D memory by not requiring individual access line drivers or individual connections between access line drivers and access lines (vertical access lines). In at least one embodiment, the multiplexors can be made up of n-type metal oxide semiconductor (nMOS) transistors formed as semiconductor circuitry under the array. In contrast to nMOS, complimentary metal oxide semiconductor (cMOS) under the array (CuA) circuitry includes both n-type and p-type transistors and is difficult to fabricate, particularly within the space constraints available under the array in a 3D memory. The use of nMOS transistors for the multiplexors makes them fabrication process friendly.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 308 in FIG. 3. Analogous elements within a Figure may be referenced with a hyphen and extra numeral or letter. Such analogous elements may be generally referenced without the hyphen and extra numeral or letter. For example, elements 103-1, 103-2, 103-A in FIG. 1 may be collectively referenced as 103. As used herein, the designators "A", "H", "M", "N", "S", and "T", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a schematic illustration of a portion of vertical 3D memory in accordance a number of embodiments of the present disclosure. FIG. 1 illustrates a circuit diagram showing a cell array of a 3D semiconductor memory device according to embodiments of the present disclosure. FIG. 1 illustrates a cell array can have a plurality of sub cell arrays 101-1, 101-2, . . . , 101-N. The sub cell arrays 101-1, 101-2, . . . , 101-N can be arranged along a second direction (D2) 111. Each of the sub cell arrays 101 can include a plurality of vertical access lines 103-1, 103-2, . . . , 103-A (which may be referred to in the art as word lines). Each of the sub cell arrays 101 can include a plurality of horizontal sense lines 105-1, 105-2, . . . , 105-S (which may be referred to as bit lines, data lines, or digit lines). In FIG. 1, the sense lines 105 are illustrated extending in a first direction 109 (D1) and the access lines 103 are illustrated extending in a third direction 113 (D3). The first direction 109 (D1) is considered to be a first horizontal direction and the second direction 111 (D2) is considered to be a second horizontal direction. The first direction 109 (D1) and the second direction 111 (D2) form a horizontal ("X-Y") plane. The third direction 113 (D3) is considered to be vertical ("Z") direction. Hence, according to embodiments described herein, the access lines 103 are extending in a vertical direction.

A memory cell (e.g., memory cell 107) can include an access device (e.g., an access transistor), and a storage node (e.g., a capacitor). An example of an access device is illustrated by the transistor 108. An example of a storage node is illustrated by the capacitor 110. A memory cell can be located at an intersection of an access line 103 and a sense line 105. For example, the memory cell 107 is located at the intersection of a particular access line 103-2 and a particular sense line 105-2. Memory cells can be written to and/or read from using the access lines 103 and sense lines 105. The sense lines 105 can electrically connect memory cells along horizontal columns of each sub cell array 101, and the access lines 103 can electrically connect memory cells along vertical rows of each sub cell array 101. Each memory cell may be uniquely addressed through a combination of an access line 103 and a sense line 105.

The sense lines 105 can be or include conducting patterns (e.g., metal lines) disposed on and spaced apart from a substrate. The sense lines 105 can extend in a first direction 109 (D1). The sense lines 105 in one sub cell array 101 can be spaced apart from each other in a vertical direction (the third direction 113 (D3)).

The access lines 103 can be or include conductive patterns (e.g., metal lines) extending in a vertical direction with respect to the substrate (e.g., in a third direction 113 (D3)). The access lines in one sub cell array 101 may be spaced apart from each other in the first direction 109 (D1).

A gate of a memory cell is connected to an access line 103 and a first terminal (e.g., first source/drain region) of an access device of the memory cell is connected to a sense line 105. A second terminal (e.g., second source/drain region) of the access device is connected to the storage node (e.g., capacitor).

Figure 2:
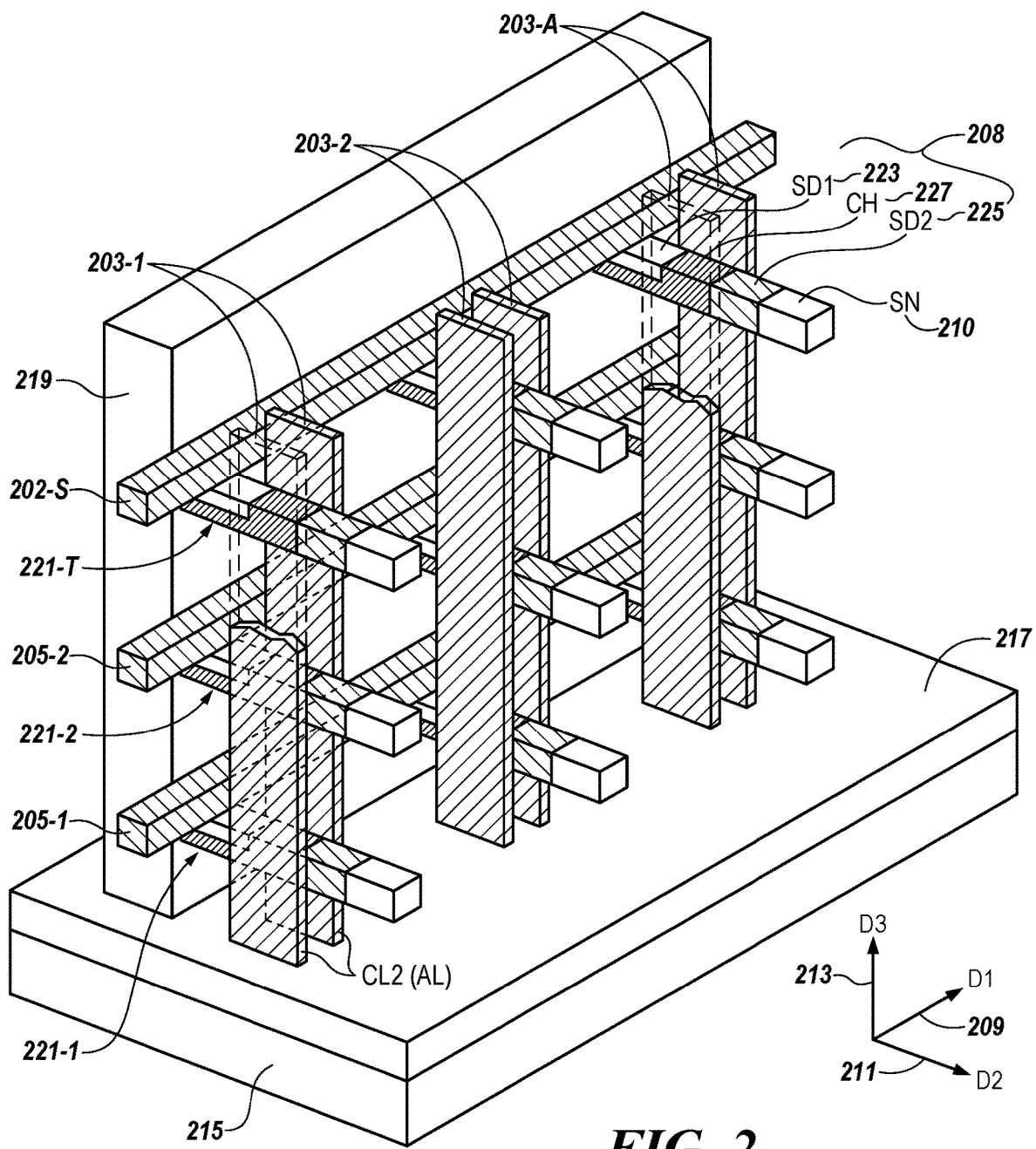
FIG. 2 is a perspective view illustrating a portion of a vertical 3D memory in accordance with a number of embodiments of the present disclosure.

FIG. 2 is a perspective view illustrating a portion of a vertical 3D memory in accordance with a number of embodiments of the present disclosure. For example, the portion of the vertical 3D memory illustrated in FIG. 2 can be a portion of a sub cell array 101 shown in FIG. 1. FIG. 2 illustrates a portion of a plurality of vertically stacked tiers 221-1, 221-2, 221-T of memory cells in an array, according to some embodiments of the present disclosure.

As shown in FIG. 2, a substrate 215 can have formed thereon one of the plurality of sub cell arrays 101 described in connection with FIG. 1. The substrate 215 may be or include a silicon substrate, a germanium substrate, or a silicon-germanium substrate, etc. Embodiments, however, are not limited to these examples.

As shown in FIG. 2, the substrate 215 can have fabricated thereon a plurality of vertically stacked tiers 221 of memory cells, where the tiers 221 of memory cells are stacked in a vertical direction (e.g., the third direction 213 (D3)). Each "tier" refers to a horizontal arrangement of memory cells in the first direction 209 (D1) and the second direction 211 (D2). The first tier 221-1 is above the substrate 215 and may be separated from the substrate 215 by an insulator material 217. The first tier 221-1 is below the second tier 221-2, which is below the third tier 221-3. The repeating tiers 221 are arranged ("stacked") vertically in the third direction 213 (D3). Each of the tiers 221 can include a plurality of memory cells. The memory cells can include laterally oriented access devices 208 and storage nodes 210. The memory cells can also include access line connections and sense line connections. For example, the memory cell that includes the access device 208 and the storage node 210 can include a connection to a particular sense line 205-S and to a particular access line 203-A. The laterally oriented access devices 208 can extend horizontally in the second direction 211 (D2).

The access devices 208 can include a first terminal 223 and a second terminal 225 separated by a channel region 227, extending laterally in the second direction 211 (D2). In some embodiments, the channel region 227 can include silicon, germanium, silicon-germanium, and/or indium gallium zinc oxide. In some embodiments, the first terminal 223 and the second terminal 225 can include an n-type dopant region formed in a p-type doped body to the access device to form an n-type conductivity transistor. In some embodiments, the first terminal 223 and the second terminal 225 can include a p-type dopant formed within an n-type doped body to the access device to form a p-type conductivity transistor. By way of example, the n-type dopant may include phosphorous atoms and the p-type dopant may include atoms of boron formed in an oppositely doped body region of polysilicon semiconductor material. Embodiments, however, are not limited to these examples.

The storage node 210 may be connected to one respective end of the access device 208. As shown in FIG. 2, the storage node 210 may be connected to the second terminal 225 of the access device 208. The storage node may be or include memory elements capable of storing data. Each of the storage nodes may be a memory element, such as a capacitor, a magnetic tunnel junction pattern, and/or a variable resistance body which includes a phase change material, etc. Embodiments, however, are not limited to these examples.

As shown in FIG. 2 a plurality of horizontal sense lines 205 extend in the first direction 209 (D1). The horizontal sense lines 205 can be arranged (e.g., "stacked") in the third direction 213 (D3). The horizontal sense lines 205 can include a conductive material, such as a doped semiconductor (e.g., doped silicon, doped germanium, etc.), a conductive metal nitride (e.g., titanium nitride, tantalum nitride, etc.), a metal (e.g., tungsten, titanium, tantalum, ruthenium, cobalt, molybdenum, etc.), and/or a metal-semiconductor compound (e.g., tungsten silicide, cobalt silicide, titanium silicide, etc.). Embodiments are not limited to these examples.

Among each of the tiers 221, the memory cells can be spaced apart from each another horizontally in the first direction 209 (D1). Within a particular tier, the components of the oriented access devices 208 (e.g., first terminal 223, second terminal 225, and channel region 227) and/or the horizontal sense lines 205 can be formed within different vertical layers. For example, the horizontal sense lines 205 can be disposed on and in electrical contact with top surfaces of first terminals 223 and orthogonal to laterally oriented access devices 208, as shown in more detail in FIG. 3. In some embodiments, the horizontal sense lines 205 are formed in a higher vertical layer of a tier 221 (farther from the substrate 200) than a layer in which the components of the access device 208 are formed. In some embodiments, the horizontal sense lines 205 can be connected to the top surfaces of the first terminal 223 directly and/or through additional contacts including metal silicide.

As shown in the example embodiment of FIG. 2, the access lines 203 extend in a vertical direction with respect to the substrate 200 (e.g., in a third direction 213 (D3)). The access lines 203 can be spaced apart from each other in the first direction 209 (D1). The access lines 203 can extend vertically relative to the substrate 200 between a pair of the access devices 208, which extend laterally in the second direction 211 (D2). The access lines 203 can be positioned adjacent to each other in a particular tier 221 along the first direction 209 (D1). Each access line 205 can extend vertically in the third direction 213 (D3) on sidewalls of respective vertically stacked access devices 208. As shown in more detail in FIG. 3, a vertical access lines 203 can be adjacent to a sidewall of a channel region 227 of a respective access device 208 in each tier 221-1, 221-2, . . . 221-T. The vertical access lines 203 can include a conductive material, such as a doped semiconductor material, a conductive metal nitride, metal, and/or a metal-semiconductor compound.

A conductive body contact 219 may be formed extending vertically in the first direction 209 (D1) along an end surface of the laterally oriented access devices 208 in each tier 221 above the substrate 200. The body contact 219 can be connected to a body (e.g., a bod region, such as is shown by 335 in FIG. 3) of the access devices 208 in each memory cell. The body contact 219 can include a conductive material, such as a doped semiconductor material, a conductive metal nitride, metal, and/or a metal-semiconductor compound.

Although not shown in FIG. 2, an insulating material may fill other spaces in the vertically stacked array of memory cells. For example, the insulating material can be one or more of a silicon oxide material, a silicon nitride material, and/or a silicon oxynitride material, etc. Embodiments, however, are not limited to these examples.

Figure 3:
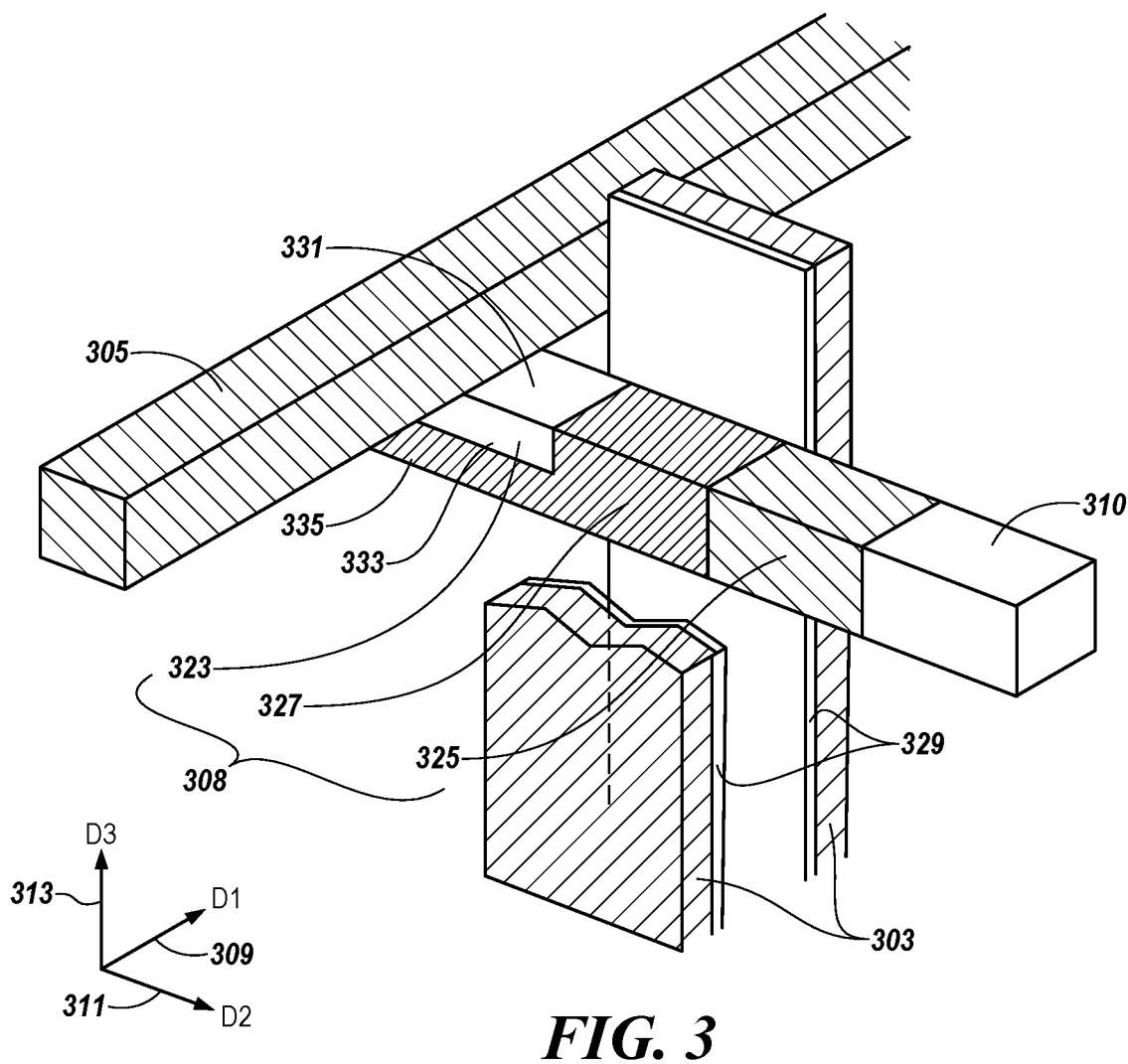
FIG. 3 is a perspective view illustrating a portion of the vertical 3D memory illustrated in FIG. 2 in greater detail.

FIG. 3 is a perspective view illustrating a portion of the vertical 3D memory illustrated in FIG. 2 in greater detail. As shown in FIG. 3, the first terminal 323 and the second terminal 325 can be impurity doped source/drain regions of the access devices 308. The first terminal 323 and the second terminal 325 can be separated by a channel 327 formed in a body of semiconductor material (e.g., body region 335) of the access devices 308. The first terminal 323 and the second terminal 325 can be formed from an n-type or p-type dopant doped in the body region 335.

For an n-type conductivity transistor construction, the body region 335 of the laterally oriented access devices 308 can be formed of a low doped (p−) p-type semiconductor material. In at least one embodiment, the body region 335 and the channel 327 separating the first terminal 323 and the second terminal 325 can include a low doped, p-type (e.g., low dopant concentration (p−)) polysilicon material consisting of boron atoms as an impurity dopant to the polycrystalline silicon. The first terminal 323 and the second terminal 325 can also comprise a metal and/or metal composite materials containing ruthenium, molybdenum, nickel, titanium, copper, a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material means a semiconductor material, such as polysilicon, containing a high level of doping with significant interaction between dopants (e.g., phosphorous, boron, etc.). Non-degenerate semiconductors, by contrast, contain moderate levels of doping, where the dopant atoms are well separated from each other in the semiconductor host lattice with negligible interaction.

In this example, the first terminal 323 and the second terminal 325 can include a high dopant concentration, n-type conductivity impurity (e.g., high dopant (n+)). In some embodiments, the high dopant, n-type conductivity first terminal 323 and second terminal 325 can include a high concentration of phosphorus atoms deposited therein. Embodiments, however, are not limited to this example. In some embodiments, the laterally oriented access devices 308 can be of a p-type conductivity construction in which case the impurity (e.g., dopant) conductivity types would be reversed.

As shown in FIG. 3, the first terminal 323 can occupy an upper portion in the body 335 of the laterally oriented access devices 308. For example, the first terminal 323 can have a bottom surface 333 within the body 335 of the access device 308, which is located higher, vertically in the third direction 313 (D3), than a bottom surface 333 of the body 335 of the access device 308. As such, the access device 308 can have a body portion 335 located below the first terminal 323 and in electrical contact with the body contact (e.g., body contact 219 shown in FIG. 2). Further, as shown in the example embodiment of FIG. 3, a horizontal sense line 305 can be disposed on a top surface 331 of the first terminal 323 and electrically coupled thereto.

As shown in FIG. 3, a vertical access line 303 can extend in the third direction 313 (D3) adjacent to a sidewall of the channel 327 of the access device 308. Such an arrangement can allow for conduction between the first terminal 323 and the second terminal 325 in the second direction 311 (D2). A gate dielectric material 329 can be interposed between the access line 303 (a portion thereof forming a gate to the access device 308) and the channel region 327. The gate dielectric material 329 can include, for example, a high-k dielectric material, a silicon oxide material, a silicon nitride material, a silicon oxynitride material, etc., or a combination thereof. Examples of high-k dielectric materials include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
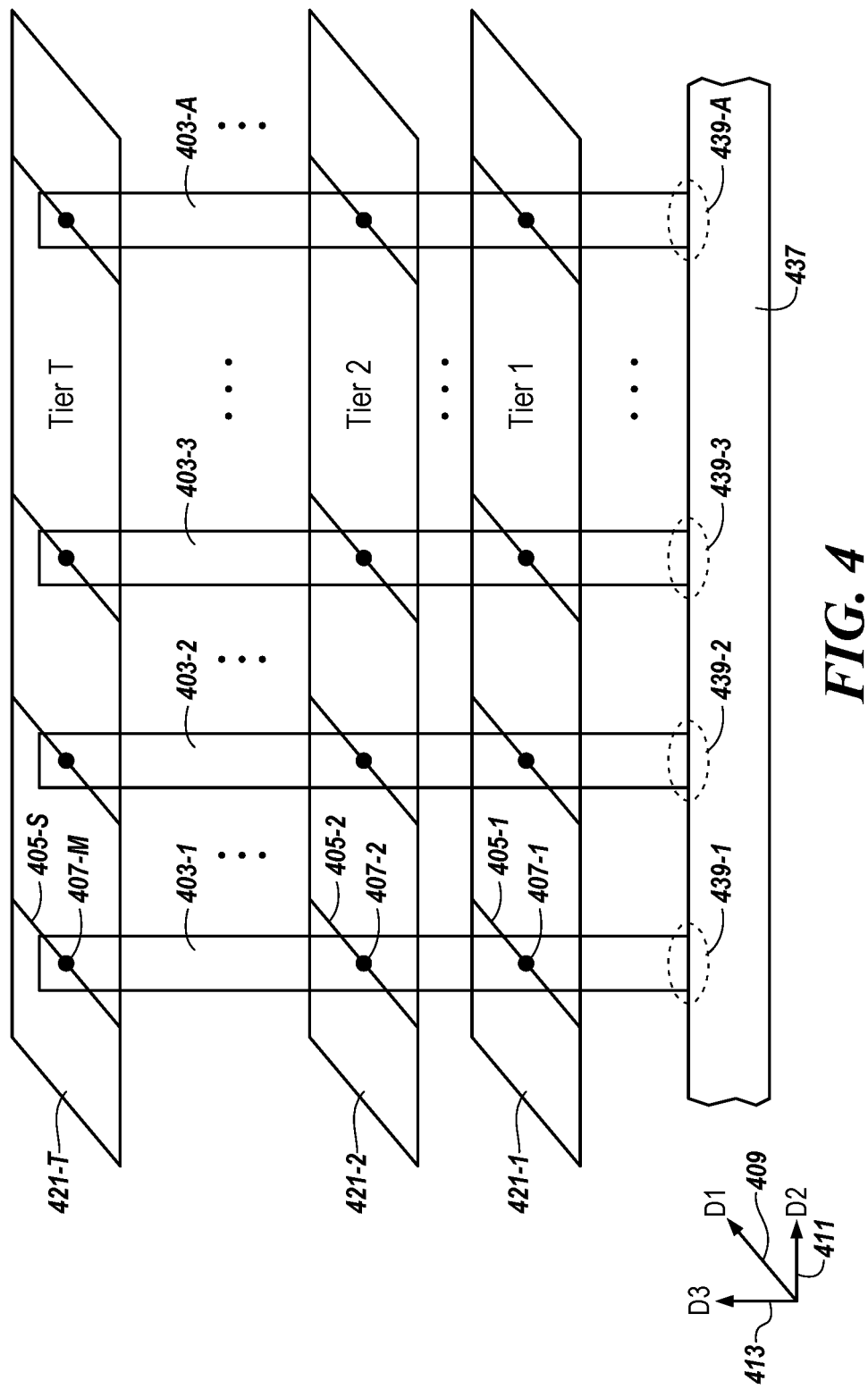
FIG. 4 is perspective schematic illustration of a portion of a vertical 3D memory in accordance a number of embodiments of the present disclosure.

FIG. 4 is perspective schematic illustration of a portion of a vertical 3D memory in accordance a number of embodiments of the present disclosure. The vertical 3D memory illustrated in FIG. 4 is analogous to that illustrated in FIGS. 1-3, but shown from a different perspective and with a different level of detail. A portion of a plurality of vertically stacked tiers 421-1, 421-2, . . . 421-T of memory cells in an array are illustrated. The tiers 421 are stacked vertically in the third direction 413 (D3). Also running through the tiers 421 in the third direction 413 (D3) are a plurality of vertical access lines 403-1, 403-2, 403-3, . . . 403-A. Each vertical access line 403 is coupled to one memory cell 407 in each tier 421. As illustrated, for example, the vertical access line 403-1 is coupled to a first memory cell 407-1 in a first tier 421-1, to a second memory cell 407-2 in a second tier 421-2, and to an Mth memory cell 407-M in a Tth tier 421-T. The coupling between vertical access lines 403 and memory cells 407 is illustrated and described in more detail with respect to FIGS. 1-3.

Each memory cell 407 is also coupled to a respective horizontal sense line 405 in each tier 421. For example, as illustrated, the first memory cell 407-1 in the first tier 421-1 is coupled to a horizontal sense line 405-1 therein. The second memory cell 407-2 in the second tier 421-2 is coupled to a horizontal sense line 405-2 therein. The Mth memory cell 407-M in the Tth tier 421-T is coupled to an Sth horizontal sense 405-S line therein. Although not specifically illustrated, each tier 421 includes a plurality of horizontal sense lines 405 that each run along the first direction 409 (D1) in parallel to each other. Each tier 421 intersects a plurality of vertical access lines 403, which run in the third direction 413 (D3). Although not specifically illustrated, the array includes additional vertical access lines 403 that run in the third direction 413 (D3) parallel to each other spaced apart from each other along the first direction 409 (D1). The next row of vertical access lines 403 along the first direction 409 (D1) are coupled to a different horizontal access line (not specifically illustrated but running parallel to the illustrated horizontal access line 437 but spaced apart from each other in the first direction 409 (D1). Each horizontal access line is coupled to a plurality of vertical access lines 403 forming a row in the second direction 411 (D2).

Each vertical access line 403 illustrated in FIG. 4 is also coupled to a particular horizontal access line 437 via a respective multiplexor 439. As illustrated, for example, the first vertical access line 403-1 is coupled to the horizontal access line 437 via a first multiplexor 439-1, the second vertical access line 403-2 is coupled to the horizontal access line 437 via a second multiplexor 439-2, the third vertical access line 403-3 is coupled to the horizontal access line 437 via a third multiplexor 439-3, and the Ath vertical access line 403-A is coupled to the horizontal access line 437 via an Ath multiplexor 439-A. The multiplexors are described in more detail with respect to FIG. 6A.

Figure 5A:
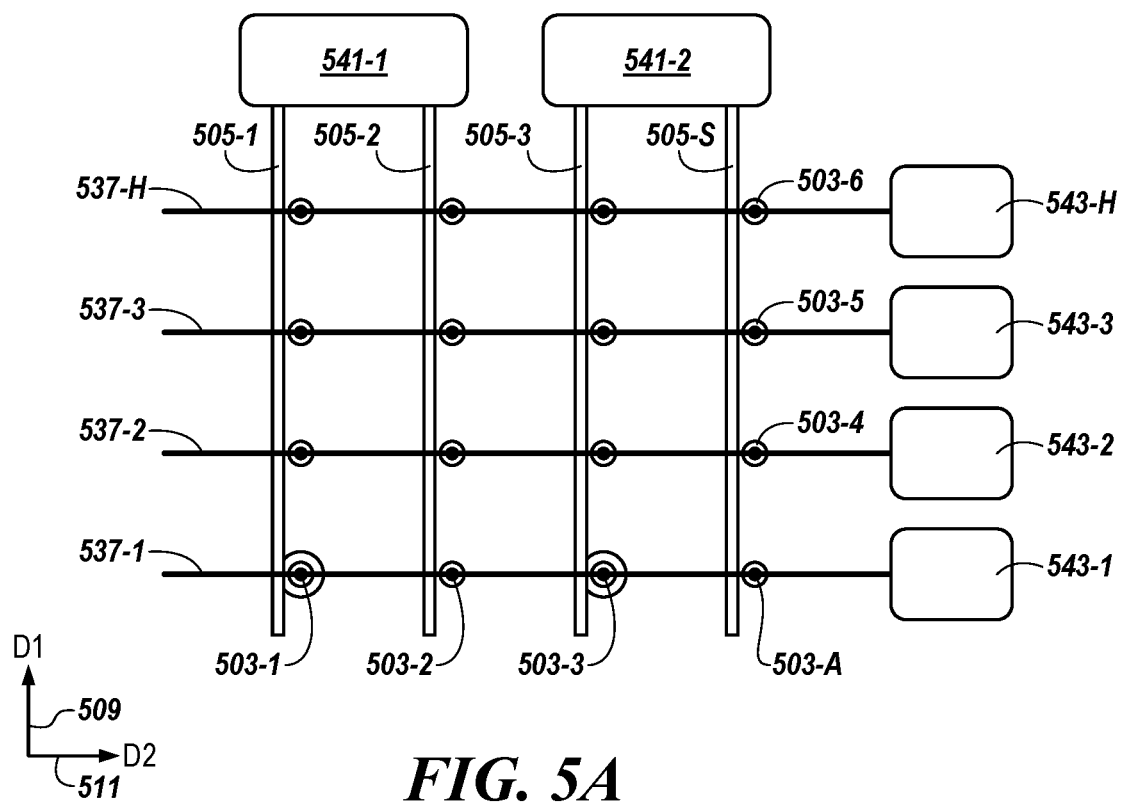
FIG. 5A is a first plane view of a portion of a 3D memory in accordance a number of embodiments of the present disclosure.

FIG. 5A is a first plane view of a portion of a 3D memory in accordance a number of embodiments of the present disclosure. The plane view in FIG. 5A shows a cross-section of a portion of the 3D memory in the first direction 509 (D1) and the second direction 511 (D2). With respect to FIG. 4, the cross-sectional view shown in FIG. 5A is taken just above the level of the horizontal access line 437 in the third direction 413 (D3) looking down (opposite of the arrow indicated for the third direction 413 (D3). A plurality of horizontal access lines 537-1, 537-2, 537-3, . . . , 537-H are shown running along the second direction 511 (D2) and spaced apart from each other in the first direction 509 (D1). Each horizontal access line 537 is coupled to a respective access line driver 543, which may be referred to in the art as a sub-word line driver. Specifically, the first horizontal access line 537-1 is coupled to a first access line driver 543-1, the second horizontal access line 537-2 is coupled to a second access line driver 543-2, the third horizontal access line 537-3 is coupled to a third access line driver 543-3, and the Hth horizontal access line 537-H is coupled to an Hth access line driver 543-H. The access line drivers 543 can be coupled to a power supply, such as a positive power supply.

A plurality of horizontal sense lines 505-1, 505-2, 505-3, 505-S are illustrated running along the first direction 509 (D1) and spaced apart from each other in the second direction 511 (D2). The 3D memory can also include a plurality of sense amplifiers 541, each coupled to a respective subset of the horizontal sense lines 505. For example, each pair of horizontal sense lines 505 can be coupled to a respective sense amplifier 541. Specifically, the first horizontal sense line 505-1 and the second horizontal sense line 505-2 are coupled to a first sense amplifier 541-1. The third horizontal sense line 505-3 and the Hth horizontal sense line 505-H are coupled to a second sense amplifier 541-2. Each sense amplifier 541 can be coupled to a subset of the horizontal sense lines 505. For example with respect to FIG. 5C, the sense amplifier 541-2 can be coupled to the horizontal sense lines 505-S, 505-4, 505-5, 505-6, which includes at least one horizontal sense line 505 in each of the tiers 521. The sense amplifiers 541 and the access line drivers 543 can be located under the array, outside of the array, and horizontally adjacent to the array of vertically stacked tiers of memory cells.

At the intersection of each horizontal sense line 505 and horizontal access line 537 is a square representing a vertical access line 503, each of which runs vertically into and out of the page in the third direction. For example, along the first horizontal access line 537-1 is illustrated a first vertical access line 503-1 at an intersection with the first horizontal sense line 505-1, a second vertical access line 503-2 at an intersection with the second horizontal sense line 505-2, a third vertical access line 503-3 at an intersection with a third horizontal sense line 505-3, and an Ath vertical access line 503-A at an intersection with the Sth horizontal sense line 505-S. Also illustrated, along the Sth horizontal sense line 505-S is a fourth vertical access line 503-4 at an intersection with the second horizontal access line 537-2, a fifth vertical access line 503-5 at an intersection with the third horizontal access line 537-3, and a sixth vertical access line 503-6 at an intersection with the Hth horizontal access line 537-H. Embodiments are not limited to the quantities of horizontal access lines, horizontal sense lines, or vertical access lines illustrated in FIG. 5A-5C.

Figure 5B:
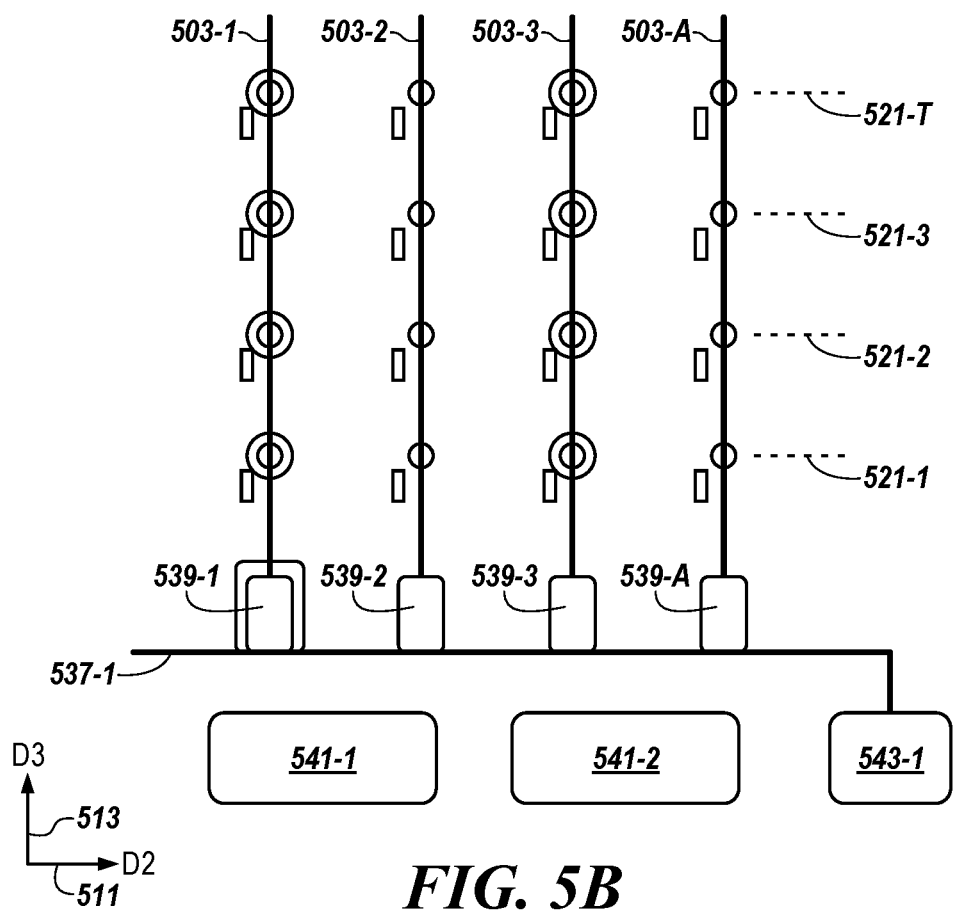
FIG. 5B is a second plane view of a portion of a 3D memory in accordance a number of embodiments of the present disclosure.

FIG. 5B is a second plane view of a portion of a 3D memory in accordance a number of embodiments of the present disclosure. The plane view in FIG. 5B shows a cross-section of a portion of the 3D memory in the third direction 513 (D3) and the second direction 511 (D2). The cross-sectional view shown in FIG. 5B is essentially a front view of what is shown in FIG. 4 (minus the perspective), with a different level of detail. The first horizontal access line 537-1 is illustrated coupled to the first access line driver 543-1. The first sense amplifier 541-1 and the second sense amplifier 541-2 are illustrated, although they are deeper in the page (in the first direction 509 (D1)) than the other illustrated elements (see FIG. 5A for reference).

Figure 5C:
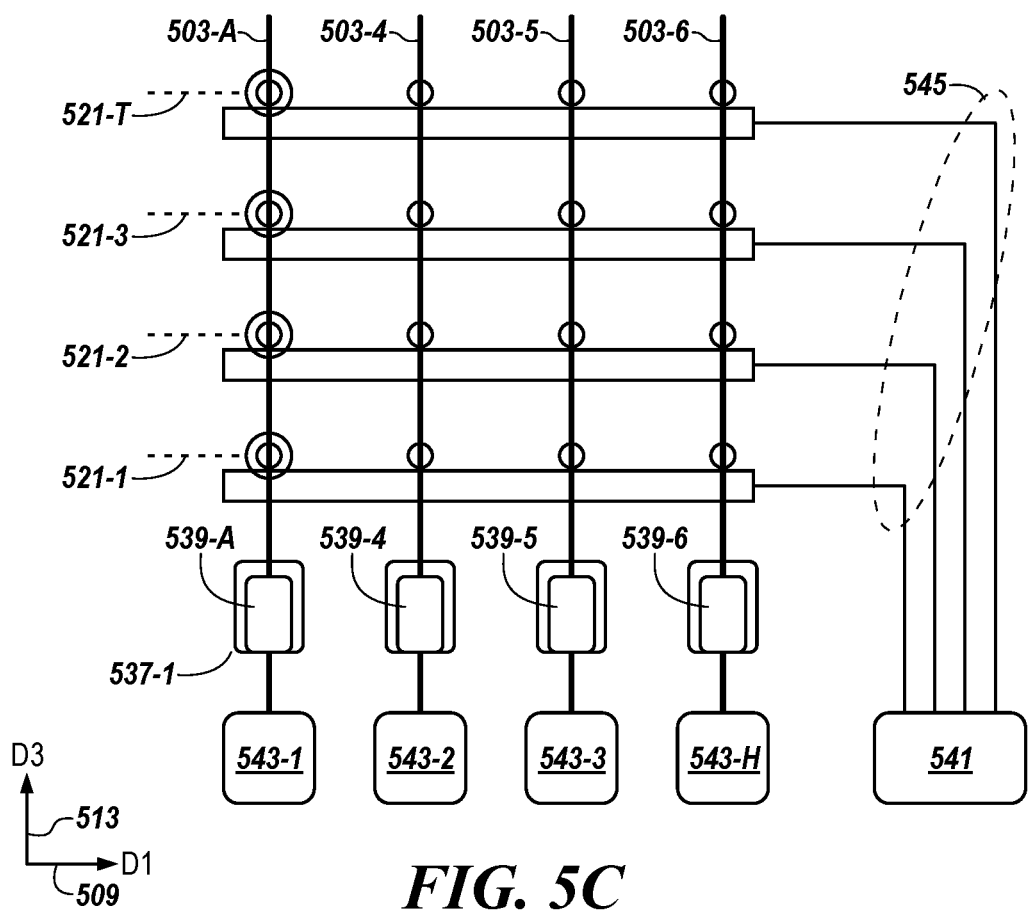
FIG. 5C is a third plane view of a portion of a 3D memory in accordance a number of embodiments of the present disclosure.

The first horizontal access line 537-1 is coupled to a plurality of vertical access lines 503 via a plurality of multiplexors 539. Specifically, the first vertical access line 503-1 is coupled to the first horizontal access line 537-1 via a first multiplexor 539-1, the second vertical access line 503-2 is coupled to the first horizontal access line 537-1 via a second multiplexor 539-2, the third vertical access line 503-3 is coupled to the first horizontal access line 537-1 via a third multiplexor 539-3, and the Ath vertical access line 503-A is coupled to the first horizontal access line 537-1 via an Ath multiplexor 539-A. The vertical access lines 503 run along the third direction 513 (D3) and are spaced apart from each other in the second direction 511 (D2). The vertical access lines 503 run along the third direction 513 (D3) through the plurality of tiers 521-1, 521-2, 521-3, . . . 521-T of memory cells. The vertical access lines 503 are each coupled to one memory cell in each tier 521. Although FIGS. 5A-5C are not drawn to scale, the tiers 521 are in line between FIGS. 5B-5C. The memory cells are represented by the small circles along each vertical access line 503 in FIG. 5B. Horizontal sense lines are represented by rectangles next to the memory cells. The horizontal sense lines run into and out of the page in the first direction 509 (D1).

At least one embodiment of the present disclosure includes a method for sensing a memory cell 507 in the array. The method can include, among a plurality of vertical access lines 503-1, 503-2, 503-3, . . . , 503-A physically coupled to each of a plurality of vertically stacked tiers 521 of memory cells and to a horizontal access line 537-1, electrically coupling a particular vertical access line 503-1 to the horizontal access line 537-1 via a particular multiplexer 539-1 in semiconductor under the array circuitry, wherein the first vertical access line 503-1 is coupled to the memory cell 507. The method can also include electrically decoupling a remainder of the plurality of vertical access lines 503-2, 503-3, . . . , 503-A from the horizontal access line 537-1 via respective other multiplexors 539-2, 539-3, . . . , 539-A in the semiconductor under the array circuitry. The method can include activating a horizontal sense line 505-1 coupled to the memory cell 507 and sensing the memory cell 507 with a sense amplifier 541-1 coupled to the horizontal sense line 505-1 via a staircase connection. A staircase connection 545 is illustrated in FIG. 5C. The sense amplifier 541-1 is horizontally adjacent to the vertically stacked tiers 521 of memory cells. Additional details of this example method are described with respect to FIGS. 6A-6B.

FIG. 5C is a third plane view of a portion of a 3D memory in accordance a number of embodiments of the present disclosure. The plane view in FIG. 5C shows a cross-section of a portion of the 3D memory in the third direction 513 (D3) and the first direction 509 (D1). Each of a plurality of horizontal access lines 537 is shown coupled to a respective access line driver 543. Specifically, the first horizontal access line 537-1 is coupled to the first access line driver 543-1, the second horizontal access line 537-2 is coupled to the second access line driver 543-2, the third horizontal access line 537-3 is coupled to the third access line driver 543-3, the Hth horizontal access line 537-H is coupled to an Hth access line driver 543-H. The horizontal access lines run into the page in the second direction 511 (D2) and are spaced apart from each other in the first direction 509 (D1).

Each horizontal access line 537 is also coupled to a respective multiplexor 539. Specifically, the first horizontal access line 537-1 is coupled to the Ath multiplexor 539-A, the second horizontal access line 537-2 is coupled to a fourth multiplexor 539-4, the third horizontal access line 537-3 is coupled to a fifth multiplexor 539-5, the Hth horizontal access line 537-H is coupled to a sixth multiplexor 539-6. The multiplexors 539 are each coupled to a vertical access line 503. Specifically, the Ath multiplexor 539-A is coupled to an Ath vertical access line 503-A, the fourth multiplexor 539-4 is coupled to a fourth vertical access line 503-4, the fifth multiplexor 539-5 is coupled to a fifth vertical access line 503-5, and the sixth multiplexor 539-6 is coupled to a sixth vertical access line 503-6. The vertical access lines 503 run along the third direction 513 (D3) and are spaced apart from each other in the first direction 509 (D1).

A plurality of horizontal sense lines 505-S, 505-4, 505, 505-6 are illustrated running along the first direction 509 (D1) and spaced apart from each other in the third direction 513 (D3). Each horizontal sense line 505 intersects each of the vertical access lines 503 illustrated in the view shown in FIG. 5C. Each horizontal sense line 505 in the view shown in FIG. 5C is coupled to a same sense amplifier 541-2 via a staircase connection 545.

Figure 6A:
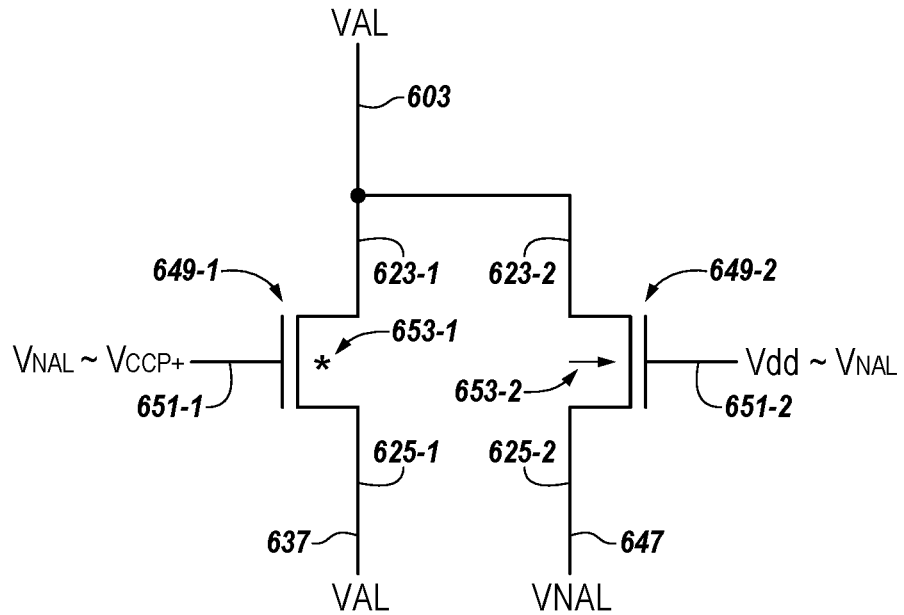
FIG. 6A is a schematic illustration of a vertical access line multiplexor in accordance a number of embodiments of the present disclosure.

FIG. 6A is a schematic illustration of a vertical access line multiplexor 639 in accordance a number of embodiments of the present disclosure. The multiplexor 639 can be formed under an array of memory cells comprising a plurality of vertically stacked tiers of memory cells, such as is illustrated in FIG. 4. The array can include a plurality of vertical access lines, such as the vertical access line 603 illustrated in FIG. 6A, coupled to the tiers of memory cells. Each vertical access line can be coupled to a respective multiplexor. For a subset of vertical access lines, the respective multiplexors function to select and/or deselect (electrically couple/decouple) the vertical access lines to/from a horizontal access line, such as the horizontal access line 637 ("HAL") illustrated in FIG. 6A. The subset of vertical access lines can be those vertical access lines coupled to the particular horizontal access line 637, where the particular horizontal access line 637 is one of a plurality of horizontal access lines under the array. The horizontal access line 637 can be coupled to a positive power supply. For example, each horizontal access line under the array can be coupled to a respective access line driver, such as the access line driver 543-1 illustrated in FIG. 5B.

The multiplexor 639 can include a first transistor 649-1 and a second transistor 649-2. The first transistor 649-1 can have a first terminal 623-1 coupled to a vertical access line 603 and to a first terminal 623-2 of the second transistor 649-2. The first transistor 649-1 can have a second terminal 625-1 coupled to a horizontal access line 637. The second transistor 649-2 can have a second terminal 625-2 coupled to a power supply 647 (e.g., a negative power supply "VNAL").

The multiplexor 639 can be configured such that deactivation of the first transistor 649-1 and activation of the second transistor 649-2 causes the respective vertical access line 603 to be electrically coupled to the negative power supply 647. To deactivate the first transistor 649-1, a signal ("Vnal") equivalent to a signal from the negative power supply 647 can be applied to a gate 651-1 of the first transistor 649-1. To activate the second transistor 649-2, a signal ("Vnal") equivalent to a signal from the negative power supply 647 can be applied to a gate 651-2 of the second transistor 649-2. Applying a signal from the negative power supply 647 is also referred to in the art as "resetting" the access line.

The multiplexor 639 can be configured such that activation of the first transistor 649-1 and deactivation of the second transistor 649-2 causes the respective vertical access line 603 to be electrically coupled to the horizontal access line 637. To activate the first transistor 649-1, a signal ("Vccp+"), described in more detail with respect to FIG. 6B, can be applied to the gate 651-1 of the first transistor 649-1. To deactivate the second transistor 649-2, a signal ("Vdd") can be applied to the gate 651-2 of the second transistor 649-2. In some embodiments, a gate oxide 653-1 of the first transistor 649-1 is thicker than a gate oxide 653-2 of the second transistor 649-2, which can serve to lower the threshold voltage of the first transistor 649-1 versus the second transistor 649-2.

Although not specifically illustrated in FIG. 6A, a control circuit can be coupled to the first transistor 649-1 and configure to apply to the gate 651-1 at a particular time, any one of a negative supply voltage ("Vnal"), a positive supply voltage ("Vccp"), and a positive supply voltage plus a threshold voltage of the first transistor 649-1 ("Vccp2"). A control circuit can be coupled to the second transistor 649-2 and configured to apply to the gate 653-2 at a particular time, any one of a negative supply voltage ("Vnal") and a voltage ("Vdd") greater than the negative supply voltage. In some embodiments, the voltage greater than the negative supply voltage can be at least one threshold voltage greater than the negative supply voltage.

In at least one embodiment, both the first transistor 649-1 and the second transistor 649-2 comprise nMOS transistors. The multiplexors 639 can be formed as semiconductor under the array circuitry, which is sometimes referred to as CuA circuitry. However, for embodiments in which both transistors of the multiplexor 639 are nMOS transistors, the circuitry can be referred to as nMOS under the array circuitry. The multiplexor 639, formed as nMOS under the array takes less space than if the multiplexor 639 was formed as cMOS under the array. According to at least one embodiment of the present disclosure, the multiplexors 639 formed as nMOS under the array, are able to fit directly under respective vertical access lines 603 such that each vertical access line 603 in the array can have an nMOS multiplexor 639 formed thereunder without sacrificing space that would otherwise be required if cMOS multiplexors were used. By way of example, a space between adjacent vertical access lines in the array can be 0.695 micrometers and a space between adjacent horizontal access lines under the array can be 0.12 micrometers. The use of cMOS multiplexors would not be feasible for given feature widths in current fabrication processes because the cMOS multiplexors could not fit within the given dimensions.

Although not specifically illustrated, the vertical access line 603 can be coupled to a plurality of gates of a plurality of memory cells in the vertically stacked tiers of memory cells. See, for example, in FIG. 2, the vertical access line 203-A is illustrated as being a gate contacting the channel 227, where the vertical access line 203-A, therefore can be said to be coupled to a gate of the memory cell associated with the access device 208 and the storage node 210 in the Tth tier 221-T. The same can be said, with respect to the access line 203-A for the memory cells coupled thereto in the first tier 221-1 and the second tier 221-2.

Although not specifically illustrated, the horizontal access line 637 can be coupled to a plurality of additional vertical access lines via a plurality of additional multiplexors. See, for example, FIG. 4, where the horizontal access line 437 is coupled to a plurality of vertical access lines 403-1, 403-2, 403-3, . . . , 403-A via a plurality of multiplexors 439-1, 439-2, 439-3, . . . , 439-A.

Although not specifically illustrated, the multiplexor 639 can be coupled to control circuitry. The control circuitry can be configured to simultaneously cause the multiplexor 639 to electrically couple the vertical access line 603 to the horizontal access line 637 and to cause the plurality of additional multiplexors to electrically decouple the plurality of additional vertical access lines from the horizontal access line 637. By way of example with respect to FIG. 4, the control circuitry can cause the multiplexor 439-1 to electrically couple the vertical access line 403-1 to the horizontal access line 437 and to cause the plurality of additional multiplexors 439-2, 439-3, . . . , 43-A to electrically decouple the plurality of additional vertical access lines 403-2, 403-3, . . . , 403-A from the horizontal access line 437.

The control circuitry can be further configured to simultaneously activate a horizontal sense line coupled to a particular memory cell in a particular tier. The particular memory cell is also coupled to the vertical access line 603. By way of example with respect to FIG. 4, the control circuitry can activate the horizontal sense line 405-1, which is coupled to the memory cell 407-1, which is coupled to the vertical access line 403-1 in the first tier 421-1. This allows the memory cell 407-1 to be sensed.

Figure 6B:
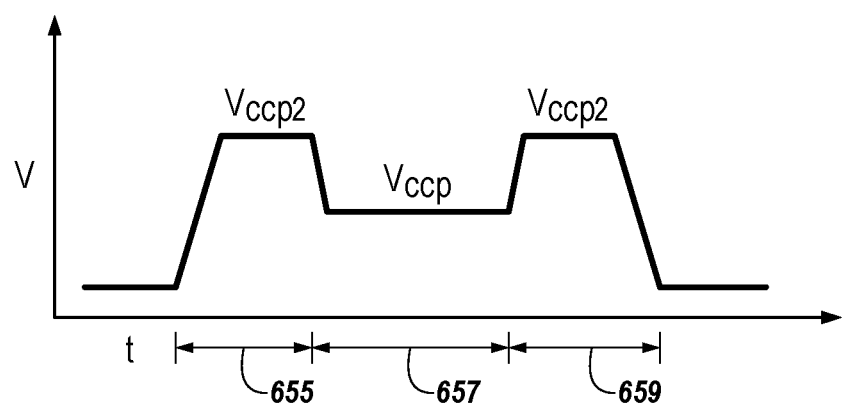
FIG. 6B is a timing diagram for operating a vertical access line multiplexor in accordance a number of embodiments of the present disclosure.

FIG. 6B is a timing diagram for operating a vertical access line multiplexor in accordance a number of embodiments of the present disclosure. The vertical axis represents signal amplitude (e.g., voltage) and the horizontal axis represents time. The signal illustrated in FIG. 6B can be a signal applied to a gate 651-1 of the first transistor 649-1 in order to activate the first transistor 649-1 to couple the vertical access line 603 to the horizontal access line 637. Such an operation can be performed to transfer a signal from the horizontal access line 637 to the vertical access line 603 (e.g., to an access device of a memory cell coupled to the vertical access line 603).

To activate the first transistor 649-1, a signal (e.g., "Vccp+" as illustrated in FIG. 6A), can be applied to the gate 651-1 of the first transistor 649-1. The signal Vccp+ can comprise a changing signal over time as illustrated in FIG. 6B. Specifically, the signal can go from low to "Vccp2" for a first period of time 655. After the first period of time 655, the signal can go from "Vccp2" to "Vccp" for a second period of time 657. After the second period of time 657, the signal can go from "Vccp" to "Vccp2" for a third period of time 659. After the third period of time, the signal can go low again. The magnitude "Vccp" can represent a charge pumped power supply signal. The magnitude "Vccp2" can represent the charge pumped power supply signal "Vccp" plus a threshold voltage of the first transistor 649-1. An example of "Vccp" is 3.0 volts and an example of Vccp2 is 4.2 volts, however embodiments are not so limited.

The first period of time 655 can be sufficient to cause a time dependent dielectric breakdown of a gate oxide of the first transistor 649-1, after which the first transistor 649-1 is considered to be activated. The second period of time 657 is a time during which the access line needs to be active in order to sense a memory cell coupled thereto. The third period of time 659 is a time during which the charge sensed from the memory cell is restored thereto via the vertical access line 603.

In the example method described above with respect to FIG. 5B, electrically coupling the particular vertical access line can include" applying a first signal ("Vccp2") to the gate 651-1 of the first nMOS transistor 649-1 for a first period of time 655, applying a second signal ("Vccp") to the gate 653-1 for a second period of time 657, applying the first signal ("Vccp2") to the gate 653-1 for a third period of time 659, and applying a third signal ("Vnal") to the gate 653-2 of the second nMOS transistor 649-2 during the first, second, and third periods of time. Electrically decoupling the remainder of the vertical access lines from the horizontal access line can include applying the third signal ("Vnal") to a respective gate of a respective first nMOS transistor of each of the respective other multiplexors for the first, second, and third periods of time and applying a fourth signal ("Vdd") to a respective gate of a respective second nMOS transistor of each of the respective other multiplexors for the first, second, and third periods of time.

Figure 7:
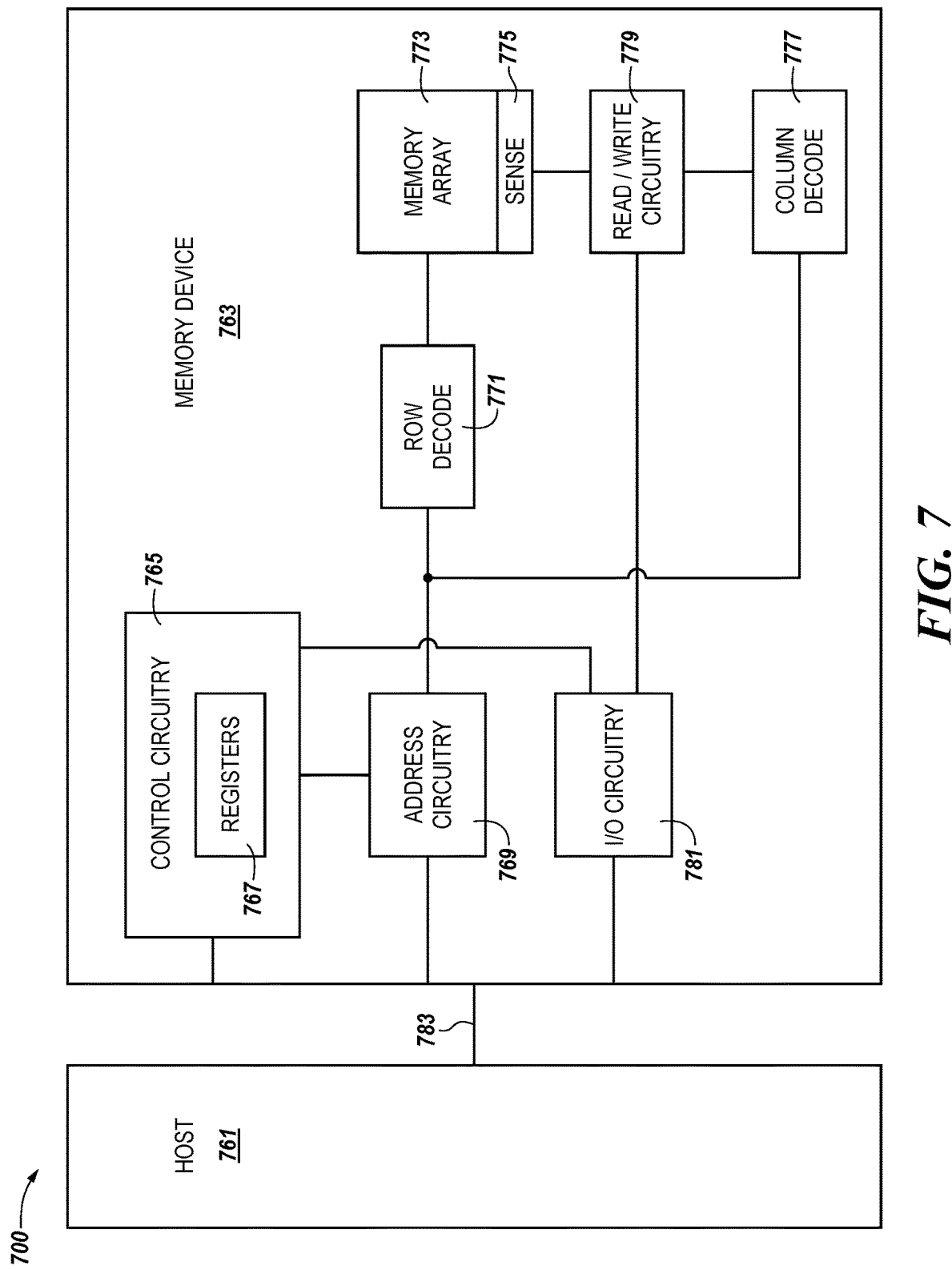
FIG. 7 is a block diagram of an apparatus in the form of a computing system including a memory device in accordance with a number of embodiments of the present disclosure.

FIG. 7 is a block diagram of an apparatus in the form of a computing system 700 including a memory device 763 in accordance with a number of embodiments of the present disclosure. As used herein, a memory device 763, a memory array 773, and/or a host 761, for example, might also be separately considered an "apparatus." According to embodiments, the memory device 763 may comprise at least one memory array 773 with an access line multiplexor for vertical access lines, according to the embodiments described herein.

In this example, system 700 includes a host 761 coupled to memory device 763 via an interface 783. The interface 783 can pass control, address, data, and other signals between the memory device 763 and the host 761. The interface can include a command bus (e.g., coupled to the control circuitry 765), an address bus (e.g., coupled to the address circuitry 769), and a data bus (e.g., coupled to the input/output (I/O) circuitry 781. In some embodiments, the command bus and the address bus can be comprised of a common command/address bus. In some embodiments, the command bus, the address bus, and the data bus can be part of a common bus. The command bus can pass signals between the host 761 and the control circuitry 765 such as clock signals for timing, reset signals, chip selects, parity information, alerts, etc. The address bus can pass signals between the host 761 and the address circuitry 769 such as logical addresses of memory banks in the memory array 773 for memory operations. The interface 783 can be a physical interface employing a suitable protocol. Such a protocol may be custom or proprietary, or the interface may employ a standardized protocol, such as Peripheral Component Interconnect Express (PCIe), Gen-Z interconnect, cache coherent interconnect for accelerators (CCIX), etc. In some cases, the control circuitry 765 is a register clock driver (RCD), such as RCD employed on an RDIMM or LRDIMM.

The computing system 700 can be a personal laptop computer, a desktop computer, a digital camera, a mobile telephone, a memory card reader, or an Internet-of-Things (IoT) enabled device, among various other types of systems. The host 761 can include a number of processing resources (e.g., one or more processors, microprocessors, or some other type of controlling circuitry) capable of accessing memory 763. The system 700 can include separate integrated circuits, or both the host 761 and the memory device 763 can be on the same integrated circuit. For example, the host 761 may be a system controller of a memory system comprising multiple memory devices 763, with the system controller 765 providing access to the respective memory devices 763 by another processing resource such as a central processing unit (CPU).

In the example shown in FIG. 7, the host 761 is responsible for executing an operating system (OS) and/or various applications (e.g., processes) that can be loaded thereto (e.g., from memory device 763 via controller 765). The OS and/or various applications can be loaded from the memory device 763 by providing access commands from the host 761 to the memory device 763 to access the data comprising the OS and/or the various applications. The host 761 can also access data utilized by the OS and/or various applications by providing access commands to the memory device 763 to retrieve said data utilized in the execution of the OS and/or the various applications.

For clarity, the system 700 has been simplified to focus on features with particular relevance to the present disclosure.

The memory array 773 can be a DRAM array comprising at least one access line multiplexor for vertical access lines according to the embodiments described herein. For example, the memory array 773 can be an unshielded DL 4F2 array such as a 3D-DRAM memory array. The array 773 is analogous to the memory array(s) described herein. Although a single array 773 is shown in FIG. 7, embodiments are not so limited. For instance, memory device 763 may include a number of arrays 773 (e.g., a number of banks of DRAM cells).

The memory device 763 includes address circuitry 769 to latch address signals provided over an interface 783. The interface can include, for example, a physical interface employing a suitable protocol (e.g., a data bus, an address bus, and a command bus, or a combined data/address/command bus). Such protocol may be custom or proprietary, or the interface 783 may employ a standardized protocol, such as Peripheral Component Interconnect Express (PCIe), Gen-Z, CCIX, or the like. Address signals are received and decoded by a row decoder 771 and a column decoder 777 to access the memory array 773. Data can be read from memory array 773 by sensing voltage and/or current changes on the sense lines using sensing circuitry 775. The sensing circuitry 775 can comprise, for example, sense amplifiers that can read and latch a page (e.g., row) of data from the memory array 773. The I/O circuitry 781 can be used for bi-directional data communication with the host 761 over the interface 783. The read/write circuitry 779 is used to write data to the memory array 773 or read data from the memory array 773. As an example, the circuitry 779 can comprise various drivers, latch circuitry, etc.

Control circuitry 765 decodes signals provided by the host 761. The signals can be commands provided by the host 761. These signals can include chip enable signals, write enable signals, and address latch signals that are used to control operations performed on the memory array 773, including data read operations, data write operations, and data erase operations. In various embodiments, the control circuitry 765 is responsible for executing instructions from the host 761. The control circuitry 765 can comprise a state machine, a sequencer, and/or some other type of control circuitry, which may be implemented in the form of hardware, firmware, or software, or any combination of the three. In some examples, the host 761 can be a controller external to the memory device 103. For example, the host 761 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    an access line multiplexor formed under a plurality of vertically stacked tiers of memory cells, the multiplexor comprising:
        a first terminal of a first n-type metal oxide semiconductor (nMOS) transistor coupled to a vertical access line and to a first terminal of a second nMOS transistor;
        a second terminal of the first nMOS transistor coupled to a horizontal access line; and
        a second terminal of the second nMOS transistor coupled to a negative power supply;
    wherein the vertical access line is coupled to a plurality of gates of a plurality of memory cells in the vertically stacked tiers;
    wherein the horizontal access line is coupled to a plurality of additional vertical access lines via a plurality of additional multiplexors; and
    wherein the apparatus further comprises control circuitry configured to simultaneously:
        cause the multiplexor to electrically couple the vertical access line to the horizontal access line; and
        cause the plurality of additional multiplexors to electrically decouple the plurality of additional vertical access lines from the horizontal access line.

2. The apparatus of claim 1, wherein the control circuitry is further configured to simultaneously activate a horizontal sense line coupled to a particular memory cell in a particular tier, wherein the particular memory cell is also coupled to the vertical access line.

3. A memory device, comprising:
    an array of memory cells comprising:
        a plurality of vertically stacked tiers of memory cells;
        a plurality of vertical access lines coupled to the plurality of tiers; and
        a respective plurality horizontal sense lines coupled to each of the plurality of tiers;
    semiconductor under the array circuitry, comprising a plurality of multiplexers, wherein each multiplexor comprises:
        a first terminal of a first transistor coupled to a respective vertical access line and to a first terminal of a second transistor;
        a second terminal of the first transistor coupled to a horizontal access line; and
        a second terminal of the second transistor coupled to a negative power supply; and
    a plurality of sense amplifiers each coupled to a respective subset of the plurality of horizontal sense lines;
    wherein the respective subset of the plurality of horizontal sense lines comprises one sense line in each of the plurality of tiers; and
    wherein the respective subset of the plurality of horizontal sense lines is coupled to the respective sense amplifier via a staircase connection.

4. The memory device of claim 3, wherein each multiplexor is configured such that deactivation of the first transistor and activation of the second transistor causes the respective vertical access line to be electrically coupled to the negative power supply.

5. The memory device of claim 4, wherein each multiplexor is configured such that activation of first transistor and deactivation of the second transistor causes the respective vertical access line to be electrically coupled to the horizontal access line.

6. The memory device of claim 3, wherein the first transistor comprises an n-type metal oxide semiconductor (nMOS) transistor; and
    wherein the second transistor comprises an nMOS transistor.

7. The memory device of claim 3, wherein a gate of the first transistor is coupled to a control circuit configured to apply to the gate at a particular time any one of:
    a negative supply voltage;
    a positive supply voltage; and
    a positive supply voltage plus a threshold voltage of the first transistor.

8. The memory device of claim 3, wherein a gate of the second transistor is coupled to a control circuit configured to apply to the gate at a particular time any one of:
    a negative supply voltage; and
    a voltage that is greater than the negative supply voltage.

9. The memory device of claim 3, further comprising a positive power supply coupled to the horizontal access line;
    wherein the horizontal access line is under the array and coupled to a subset of the plurality of vertical access lines.

10. The memory device of claim 3, wherein the horizontal access line is one of a plurality of horizontal access lines under the array.

11. The memory device of claim 10, wherein each of the plurality of horizontal access lines is coupled to respective access line driver; and
    wherein the respective access line driver is located outside of the array and horizontally adjacent to the array.

12. A method of sensing a memory cell in an array, comprising:

among a plurality of vertical access lines physically coupled to each of a plurality of vertically stacked tiers of memory cells and to a horizontal access line:
  electrically coupling a particular vertical access line of the plurality of vertical access lines to the horizontal access line via a particular multiplexer in semiconductor under the array circuitry, wherein the particular vertical access line is coupled to the memory cell;
  electrically decoupling a remainder of the plurality of vertical access lines from the horizontal access line via respective other multiplexors in the semiconductor under the array circuitry;
  activating a horizontal sense line coupled to the memory cell; and
  sensing the memory cell with a sense amplifier coupled to the horizontal sense line via a staircase connection, wherein the sense amplifier is horizontally adjacent to the plurality of vertically stacked tiers of memory cells.

13. The method of claim 12, wherein electrically coupling the particular vertical access line to the horizontal access line comprises:
  applying a first signal to a gate of a first n-type metal oxide semiconductor (nMOS) transistor of the particular multiplexor for a first period of time;
  applying a second signal to the gate of the first nMOS transistor for a second period of time;
  applying the first signal to the gate of the first nMOS transistor for a third period of time; and
  applying a third signal to a gate of a second nMOS transistor of the particular multiplexor during the first, second, and third periods of time.

14. The method of claim 13, wherein applying the first signal to the gate of the first nMOS transistor for the first period of time comprises applying the first signal for an amount of time sufficient to cause time dependent dielectric breakdown of a gate oxide of the first nMOS transistor.

15. The method of claim 13, wherein applying the first signal comprises applying a positive supply voltage plus a threshold voltage of the first nMOS transistor; and
  wherein applying the second signal comprises applying the positive supply voltage.

16. The method of claim 15, wherein applying the third signal comprises applying a negative supply voltage.

17. The method of claim 13, wherein electrically decoupling the remainder of the plurality of vertical access lines from the horizontal access line comprises:
  applying the third signal to a respective gate of a respective first nMOS transistor of each of the respective other multiplexors for the first, second, and third periods of time; and
  applying a fourth signal to a respective gate of a respective second nMOS transistor of each of the respective other multiplexors for the first, second, and third periods of time.

* * * * *